United States Patent
Yuan et al.

(10) Patent No.: US 7,184,341 B2
(45) Date of Patent: Feb. 27, 2007

(54) METHOD OF DATA FLOW CONTROL FOR A HIGH SPEED MEMORY

(75) Inventors: Der-Min Yuan, Taipei (TW); Chiun-Chi Shen, Hsin-Chu (TW)

(73) Assignee: Etron Technology, Inc., Hsin-Chu (TW)

( * ) Notice: Subject to any disclaimer, the term of this patent is extended or adjusted under 35 U.S.C. 154(b) by 57 days.

(21) Appl. No.: 10/899,243

(22) Filed: Jul. 26, 2004

(65) Prior Publication Data

US 2006/0039231 A1 Feb. 23, 2006

(51) Int. Cl.
*G11C 7/00* (2006.01)
(52) U.S. Cl. .................. 365/203; 365/189.01; 365/229
(58) Field of Classification Search ................ 365/203, 365/229, 189.01
See application file for complete search history.

(56) References Cited

U.S. PATENT DOCUMENTS

| | | | |
|---|---|---|---|
| 4,899,317 A * | 2/1990 | Hoekstra et al. ............ 365/203 |
| 5,917,748 A * | 6/1999 | Chi et al. .................... 365/168 |
| 6,154,418 A | 11/2000 | Li ............................... 365/233 |
| 6,215,710 B1 | 4/2001 | Han et al. .................... 365/193 |
| 6,229,757 B1 | 5/2001 | Nagata et al. ............... 365/233 |
| 6,735,140 B1 * | 5/2004 | Fiscus et al. ................ 365/222 |
| 6,741,497 B2 * | 5/2004 | Roohparvar et al. ... 365/185.08 |
| 6,760,251 B2 * | 7/2004 | Hidaka ........................ 365/171 |
| 6,813,193 B2 * | 11/2004 | Vogelsang ............. 365/189.05 |

* cited by examiner

*Primary Examiner*—David Lam
(74) *Attorney, Agent, or Firm*—Saile Ackerman LLC; Stephen B. Ackerman

(57) ABSTRACT

A new method of increasing access cycle time in a memory device is achieved. The memory device has three operating states of standby, read, and write. The data lines in the memory device may be pre-charged. The method comprises, first, during the standby state, the data lines are pre-charge. Second, during the write state, the data lines are not pre-charged. Third, during the read state, the data lines are not pre-charged. During a transition from the write state to the read state, the data lines are pre-charged.

12 Claims, 5 Drawing Sheets

METHOD OF DATA FLOW CONTROL FOR A HIGH SPEED MEMORY

BACKGROUND OF THE INVENTION (1) Field of the Invention

The invention relates to dynamic memory data flow, and more particularly, to a data flow scheme for a high speed DRAM that selectively precharges the data line and data line bar signals of selected cells to improve the read and write speeds.

(2) Description of the Prior Art

Dynamic memory, of DRAM, devices are used in a variety of applications, such as personal computers. DRAM devices offer a low cost, high memory capacity alternative to static or SRAM devices. However, with the advent of microprocessors capable of operation in excess of 1 gigahertz, the access speed of the DRAM can become an operational bottleneck for the system. To improve the performance of the DRAM, double date rate (DDR) devices have been developed wherein data may be accessed using both the rising and falling edges of the system clock.

Referring now to FIG. 1, a part of a prior art DRAM memory device is shown. A single DRAM bit cell 6 is shown as the storage capacitor $C_{CELL}$ 24 and the access transistor NC 23. The memory state of the bit cell 6 depends on the charge stored on $C_{CELL}$ 24. A bit line (BL) sense amplifier 4 is shown. The BL sense amplifier 4 comprises a pair of cross-coupled inverters 10 and 14 that are coupled between the BL and BLB nodes. The BL node is coupled to the drain of the word line access transistor NC 23 for the bit cell 6. Bit select (BS) transistors N1 18 and N2 22 are used to selectively couple the BL and BLB nodes to the data line (DL) and DLB nodes. A write driver 25 and a data line amplifier 26 are further coupled to the DL and DLB lines. While only a single bit cell 6 is shown it is understood that a useful DRAM memory device would comprise a plurality of such memory cells 6 and BL sense amplifiers 4 are arranged in an addressable array.

Referring now to FIG. 2, a prior art timing diagram demonstrates the signal performance of the prior art device. The device clock is shown as CLK. In the diagram, the device begins in the ACCESS STATE of STANDBY or ACTIVE. During the STANDBY state, the WL is not asserted. Therefore, the bit cell 6 is not selected and the stored charge is retained in $C_{CELL}$ 24. Further, the BL and BLB signals are pre-charged to about ½ the VCC voltage of the circuit. This pre-charge operation is called a ROW PRECHARGE and is performed so that the BL and BLB nodes are in a preferred condition for a read operation.

The DL and DLB nodes are pre-charged to about VCC during this STANDBY state. This pre-charge operation is called a COLUMN PRECHARGE. The COLUMN PRECHARGE STATE is shown on the diagram. During the STANDBY state, the COLUMN PRECHARGE STATE is ON.

The DRAM device transitions to the WRITE state due to an external access command. In response to the WRITE state transition, the WL for a selected bit cell is asserted. Note that the DRAM device selects a particular group of bit cells, such as a byte or word, based on the address given by the external writing device. The assertion of WL causes the bit cell access transistor NC 23 to turn ON. With NC 23 ON, the charge on $C_{CELL}$ 24 is shared onto the BL node. The BL and BLB signals voltages will deflect from the ½ VCC value to reflect this charge sharing. The BL sense amplifier 4 amplifies the voltage difference between BL and BLB to cause BL and BLB signals to be driven to a larger differential value.

The bit select (BS0) signal for the first column is asserted 34 to couple DL to BL and DLB to BLB. As an important observation, note that both the DL and DLB signals are in the COLUMN PRECHARGE STATE of VCC prior to the assertion of BS0. In the prior art, the COLUMN PRECHARGE is synchronized to the bit select signal. Once the PRECHARGE is turned OFF 36, the WR DRIVER 25 forces a differential voltage on DL and DLB corresponding to the data state that is being written to the cell 6. In this case, the DL signal is forced low 38 while DLB is held at VCC such that a low state (VSS) can be written into the cell 6.

A potential problem in the operating design is shown when the DL signal exhibits a slow transition 38 from high to low due to excessive RC loading of the DL signal. In some DRAM designs, the DL or DLB lines have very long conductive line routings of, for example, 4000 microns. The RC loading represented by these long routings can slow the DL and DLB switching significantly. Further, note that the DL signal delay causes the BL0 and BL0B signal switching to be delayed. In the worst case, the BL0/BL0B signals may be delayed beyond the available BS0 window. The result is a MISSED BIT WRITE by the BL sense amplifier. If the DRAM is operated at a high speed, data errors will result from the operating design of the prior art device. After the write of the second byte (BS1), the COLUMN PRECHARGE STATE returns to the ON state 42. Once again, the PRECHARGE STATE is synchronized to the bit select signals (BS0 and BS1).

The DRAM device now transitions to a READ state. Note that COLUMN PRECHARGE STATE continues to be ON until the first data read operation 44. The READ operation begins with an external read access to the DRAM device. BS0 is asserted to cause the BL and BLB charge sharing and BL sense amplification to occur as described above. When the BS0 is enabled for this column, DL is again coupled to BL and DLB is again coupled to BLB. The sense amplifier 4 drives the DL and DLB lines with the differential voltage as shown. After the READ operation, the device returns to the STANDBY state, and the WL row is deactivated 46.

Several prior art inventions describe high speed DRAM methods and circuits. U.S. Pat. No. 6,154,418 to Li discloses a writing scheme for a double data rate (DDR) synchronous DRAM (SDRAM). The memory bank is divided into two planes. U.S. Pat. No. 6,215,710 to Han et al describes a method for controlling a data strobe signal for a DDR SDRAM. U.S. Pat. No. 6,229,757 to Nagata et al describes a data strobe method and a circuit for a DDR SDRAM.

SUMMARY OF THE INVENTION

A principal object of the present invention is to provide an effective method to generate read/write access a high speed DRAM.

A further object of the present invention is to provide a method to increase the DRAM sense amplifier writing speed by not precharging the data line and data line bar signals between writes.

Another further object of the present invention is to provide a method to increase DRAM sense amplifier reading speed by not precharging the data line and the data line bar signals between reads.

Another further object of the present invention is to increase the access speed by turning OFF the data line precharge prior to the assertion of the bit select line.

Another further object of the present invention is to facilitate read interrupt of a write command by precharging the data line and the data line bar signals at a read interrupt.

Another yet further object of the present invention is to provide a method that is compatible with a high speed, double data rate (DDR) DRAM device.

In accordance with the objects of this invention, a method of increasing access cycle time in a memory device. The memory device has three operating states of standby, read, and write. The data lines in the memory device may be pre-charged. The method comprises, first, during the standby state, the data lines are pre-charge. Second, during the write state, the data lines are not pre-charged. Third, during the read state, the data lines are not pre-charged. During a transition from the write state to the read state, the data lines are pre-charged.

Also in accordance with the objects of this invention, a memory device having increased access cycle time is achieved. The memory device comprises data lines that may be pre-charged, a standby state during which the data lines are pre-charged, a write state during which the data lines are not pre-charged, and a read state during which the data lines are not pre-charged. A transition from the write state to the read state causes the data lines to be pre-charged.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method of writing a DRAM bit cell in a DRAM device of the present invention. A method of sequentially writing and then reading is also disclosed. The method selectively pre-charges the data line and data line bar to achieve faster writing and reading operation. It should be clear to those experienced in the art that the present invention can be applied and extended without deviating from the scope of the present invention.

Figure 1:
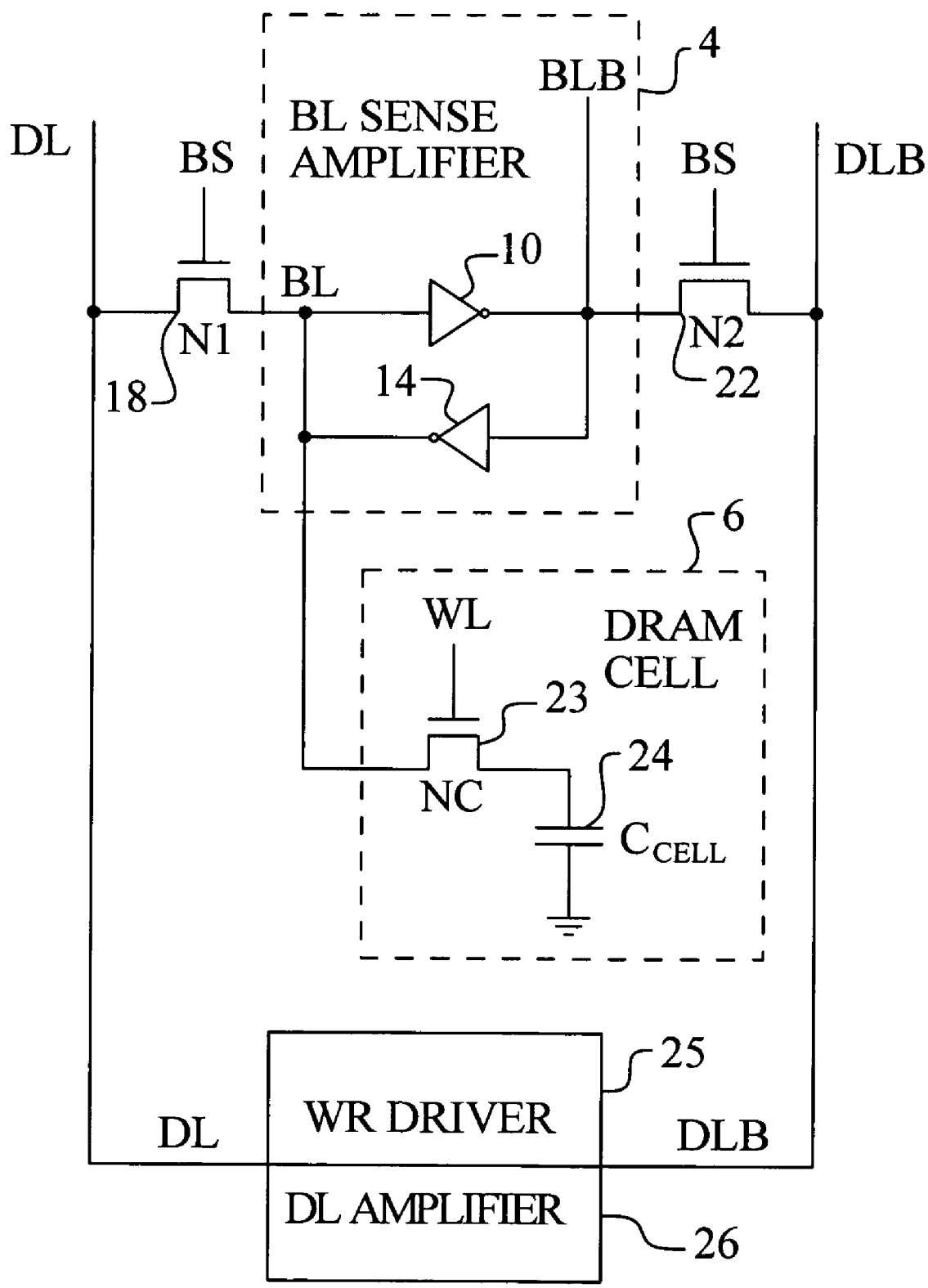
FIG. 1 illustrates a prior art DRAM memory cell.
Figure 2:
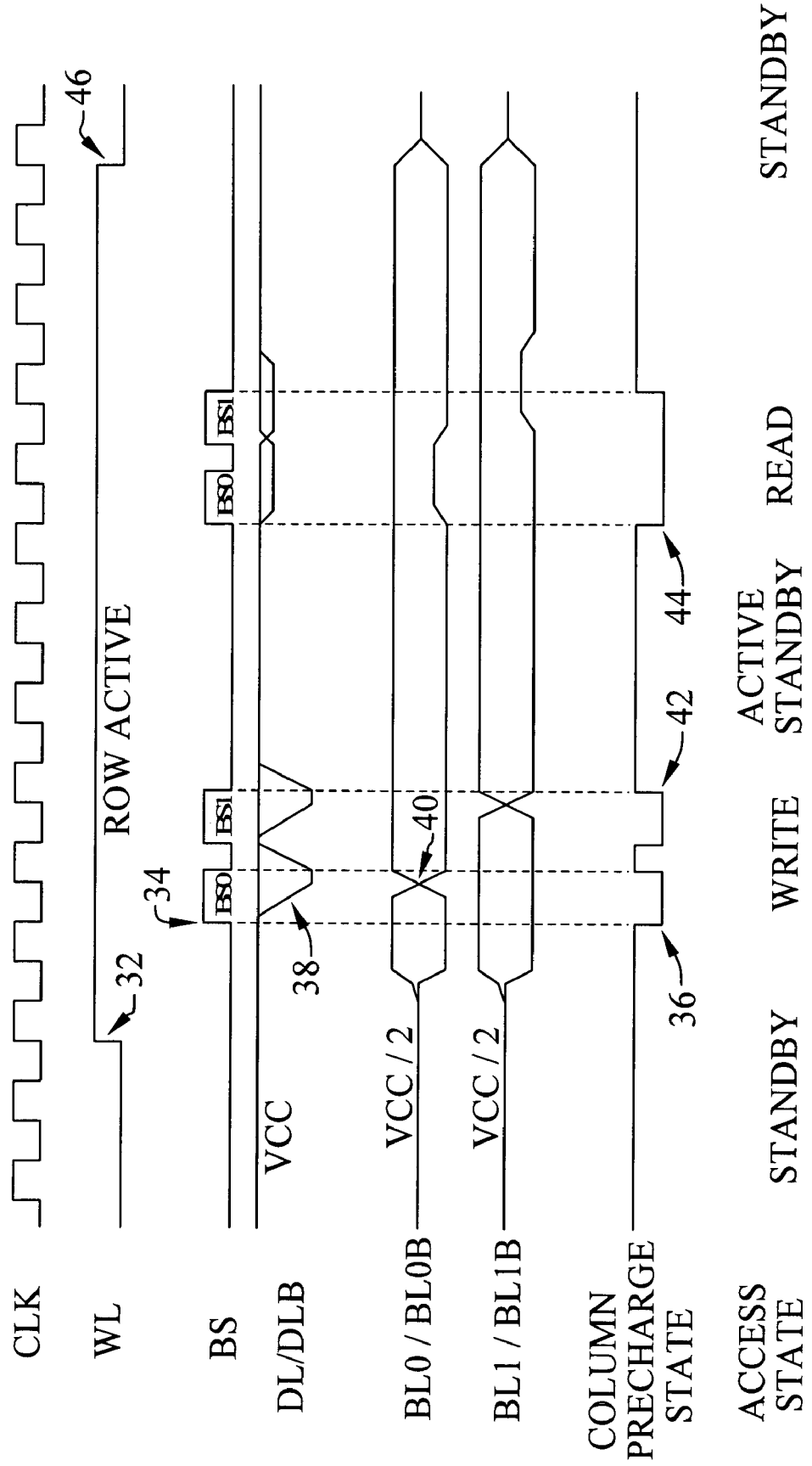
FIG. 2 illustrates a prior art operation timing diagram.
Figure 3:
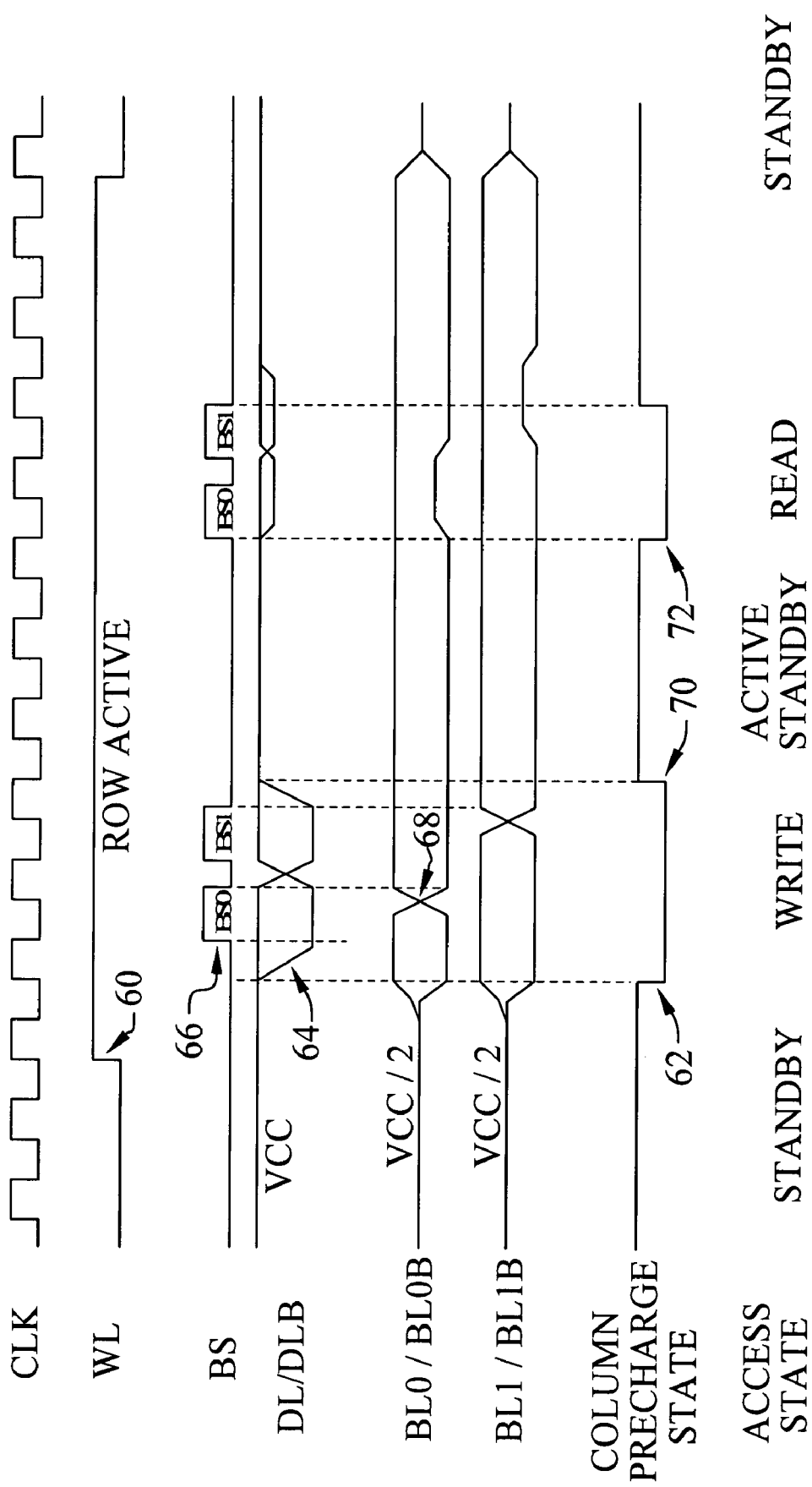
FIG. 3 illustrates the preferred embodiment of the operation timing diagram and data flow of the present invention.

Referring now to FIG. 3, the preferred embodiment of the method of present invention is shown. Several important features of the present invention are shown in the timing diagram. The present invention is disclosed in the preferred embodiment as a novel method for selectively precharging the data line and data bar line for standby, read, write, and read interrupt of write modes. The method is preferably applied to a DRAM device, and, more preferably, to a DDR DRAM. The method is herein described as applied to the example memory cell of the prior art FIG. 1, but should not be construed as limited to this application.

Referring again to FIG. 3, a clock CLK is used to synchronize the functions of the method. The DRAM is operated in one of three modes: STANDBY, WRITE, and READ, as shown by the ACCESS STATE. The ACCESS STATE is determined by the control word values of the external interface of the DRAM. The bit select BS signal is shown responding to WRITE and READ accesses. The row word line (WL), data line DL and data line bar DLB are shown. Combined bit line (BL) and bit line bar (BLB) for a first selected cell BL0/BL0B and second selected cell BL1/BL1B are shown. Finally, the COLUMN PRECHARGE STATE is shown for the bit cell operation for standby, write, and read accesses. The standby mode ends and the write mode begins at the COLUMN PRECHARGE STATE transition at 62 in FIG. 3.

During the STANDBY state, the DRAM bit cell is not being written to or read from. The BL and BLB nodes are pre-charged to a common voltage preferably comprising about ½ VCC. The WL to the cell 6 is not asserted so the cell 6 is isolated from the BL sense amplifier 4. The bit select signals, BS0 and BS1, are not asserted so that the DL and DLB lines are de-coupled from the BL0/BL0B and BL1/BL1B lines. As an important feature of the present invention, note that the COLUMN PRECHARGE STATE is ON during STANDBY such that the DL and DLB nodes are each pre-charged to a common voltage of preferably the device power supply (VCC) during this STANDBY state.

The bit cell writing process begins when the DRAM device transitions to the WRITE state due to an external access command. In response to the WRITE state transition, first, a selected bit cell 6 is coupled to a bit line. This coupling is performed by asserting the WL 60 for the selected bit cell 6. Note that the DRAM device typically selects a particular group of bit cells, such as a byte or word, based on the address given by the external writing device using decoding methods well known in the art. The assertion of WL causes the bit cell access transistor NC 23 to turn ON. With NC ON, the charge on $C_{CELL}$ 24 is shared onto the BL node. The bit line signals, BL0/BL0B and BL1/BL1B will deflect from the ½ VCC value to reflect this charge sharing. The BL sense amplifier 4 amplifies the voltage difference between BL and BLB to cause BL and BLB signals to be driven to a larger differential value.

As in the prior art, DL and DLB are de-coupled from the BL and from BLB during this step. However, as an important feature of the present invention, the COLUMN PRECHARGE STATE is now switched OFF prior to the assertion of the bit select 66. Further, DL and DLB are immediately coupled to complementary voltages corresponding to a desired bit write value. For example, if the desired bit write value is a '1' corresponding to a high voltage on the storage capacitor $C_{CELL}$ 24, then DL is driven to VCC while DLB is driven to the complementary voltage of VSS 64. Alternatively, if a logic '0', corresponding to a low voltage, is the desired bit write value, then DL is driven to VSS while DLB is driven to the complementary voltage of VCC.

Note that the novel method of the present invention presets the DL and DLB levels prior to turning ON 66 the bit select transistors N1 18 and N2 22. The timing problem of the prior art method is thereby avoided. The DL and DLB transition delays, due to RC loading, are taken into account by the setup time T1. In this way, the DRAM bit cell 6 can be written using a very short bit select (BS) time. The bit line values 68 have sufficient time to reach the final state before the end of the bit select time.

As another important feature, the COLUMN PRECHARGE remains OFF during subsequent writes. This prevents charging delays. After the sequence of data is written, the PRECHARGE is re-enabled 70, and the device enters STANDBY. Note that PRECHARGE is not turned ON 70 until after the falling edge of the bit select. If a READ operation then occurs during STANDBY, then the COL- UMN PRECHARGE is turned OFF 72 when the bit select (BS0) is enabled. In this case, the method does not require that the PRECHARGE be turned OFF prior to BS0 because the data lines (DL/DLB) are not discharged to VSS and have sufficient transition time.

Figure 4:
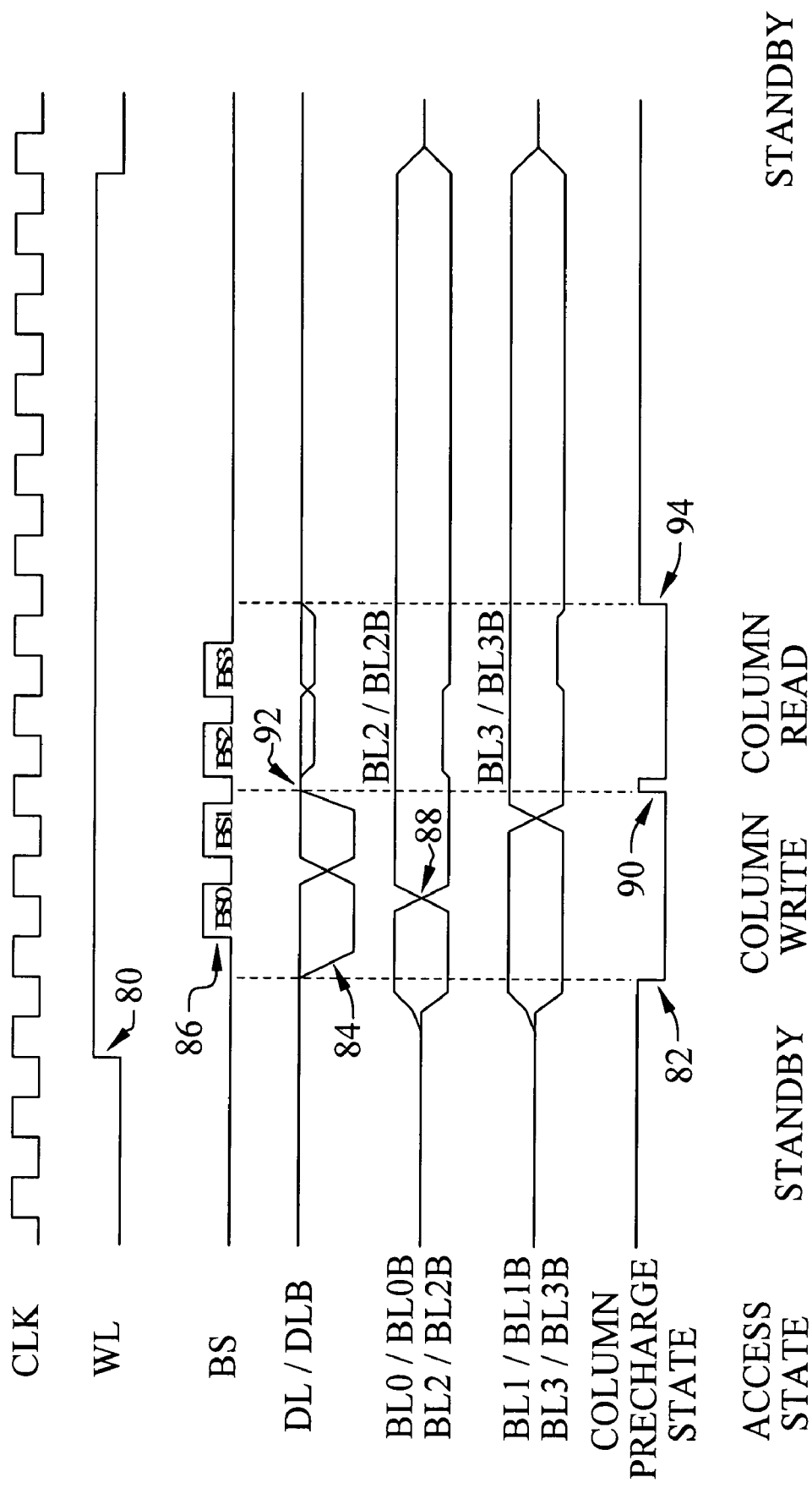
FIG. 4 illustrates the preferred embodiment operation timing where a read interrupts a write.

Referring now to FIG. 4, a special case when a read interrupts a write is illustrated. First, a column write is performed as described above. The word line WL is asserted 80. The COLUMN PRECHARGE is disabled 82 prior to the assertion of the bit select (BS0) 86 to allow the data lines to deflect to complimentary states 84. After the bit select (BS0) is asserted, the bit lines BL0/BL0B deflect to complimentary states in response to DL/DLB. After a second data write, a read interrupt of the write occurs due to a read command to the device. The COLUMN PRECHARGE is immediately asserted 90 to return DL/DLB to VCC 92. However, this is a brief PRECHARGE and the COLUMN PRECHARGE is then turned OFF for the balance of the READ. This brief precharging of DL/DLB speeds the reading operation. By omitting subsequent precharge steps, the read operating speed is increased. During each read, the bit select transistors N1 18 and N2 22 are turned on to couple DL to BL and DLB to BLB. This allows the BL sense amplified small signal value to be driven onto the data lines for external access. After the READ completes, the COLUMN PRE-CHARGE is turned back ON 94.

Figure 5:
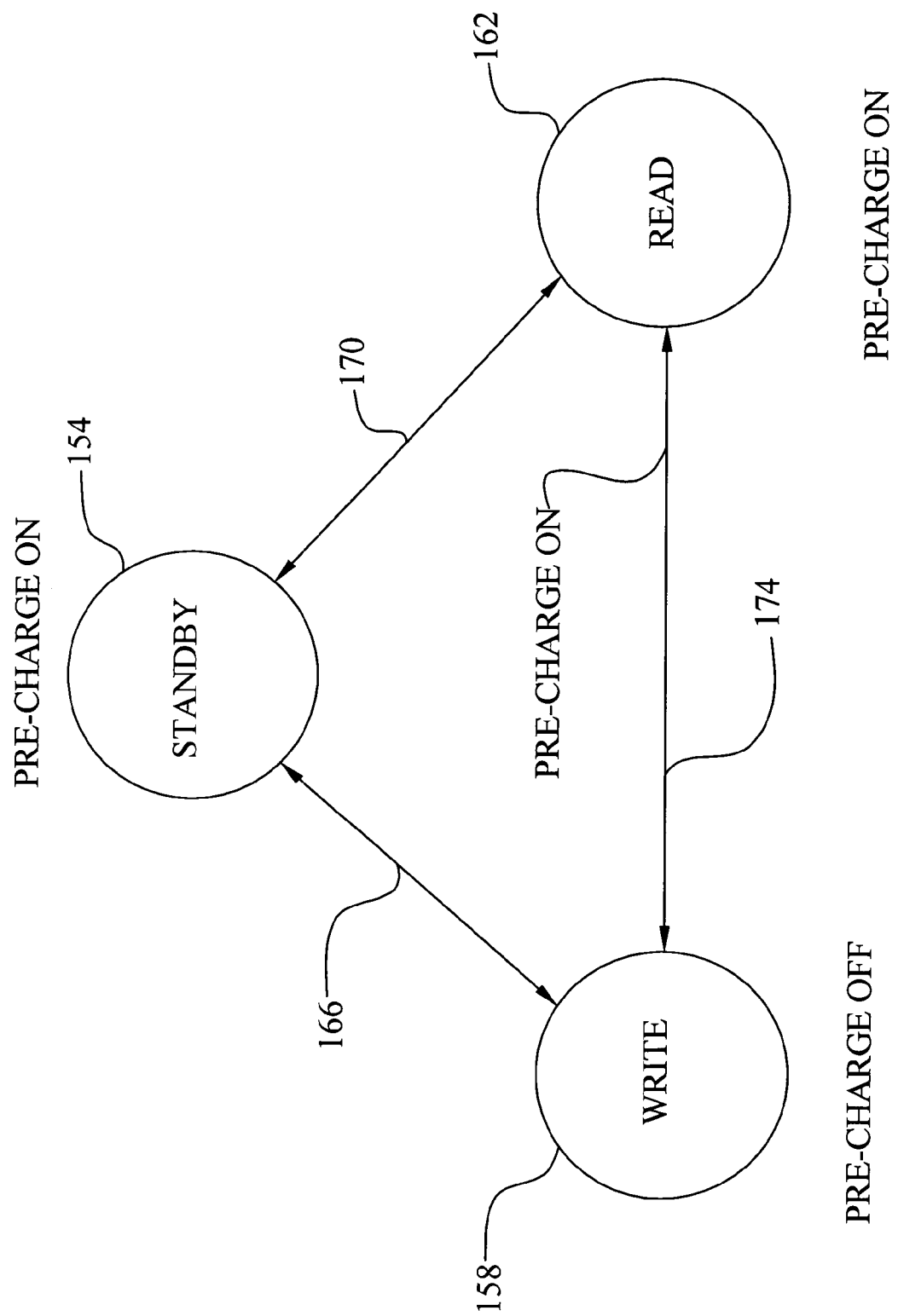
FIG. 5 illustrates a state diagram for memory access according to the present invention.

Referring now to FIG. 5, a state diagram of the memory device of the present invention is illustrated. The memory device comprises three states of STANDBY 154, WRITE 158, and READ 162. The state transitions include STANDBY-TO-READ 170, READ-TO-STANDBY 170, STANDBY-TO-WRITE 166, WRITE-TO-STANDBY 166, and WRITE-TO-READ 174. During the WRITE state 158 and READ state 162, the PRE-CHARGE is OFF. During STANDBY 154, the PRE-CHARGE is ON. During a transition 174 from WRITE state 158 to READ state 162, the PRE-CHARGE is also ON. In addition, an active STANDBY state 154 comprises an active wordline, no reading or writing, and PRE-CHARGE ON.

The advantages of the present invention may now be summarized. An effective method to generate read/write accesses to a high speed DRAM is achieved. The method increases the DRAM sense amplifier writing speed by not precharging the data line and data line bar signals between writes. The method increases the DRAM sense amplifier reading speed by not precharging the data line and the data line bar signals between reads. The method facilitates read interrupt of a write command by precharging the data line and the data line bar signals at a read interrupt. Finally, the method is compatible with a high speed, double data rate (DDR) DRAM device.

As shown in the preferred embodiments, the novel DRAM data flow method provides an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method of increasing access cycle time in a memory device, wherein said memory device has three operating states of standby, read, and write, and wherein data lines in said memory device may be pre-charged, said method comprising:

during said standby state, said data lines are pre-charged;

during said write state, said data lines are not pre-charged;

during said read state, said data lines are not pre-charged;

during a transition from said write state to said read state, said data lines are pre-charged; and further comprising an active standby state during which no write or read takes place, during which a wordline is active, and during which said data lines are pre-charged.

2. The method according to claim 1 wherein said memory device is a DRAM device.

3. The method according to claim 2 wherein said DRAM device is a DDR device.

4. The method according to claim 1 wherein said transition from said write state to said read state is an interruption of an ongoing write.

5. A method of increasing access cycle time in a memory device, wherein said memory apparatus has three operating states of standby, read, and write, and wherein data lines in said memory may be pre-charged, said method comprising:

during said standby state, said data lines are pre-charged;

during said write state, said data lines are not pre-charged;

during said read state, said data lines are not pre-charged; and during a transition from said write state to said read state, said data lines are pre-charged wherein said transition from said write state to said read state is an interruption of an ongoing write.

6. The method according to claim 5 wherein said memory device is a DRAM device.

7. The method according to claim 6 wherein said DRAM device is a DDR device.

8. The method according to claim 5 further comprising an active standby state during which no write or read takes place, during which a wordline is active, and during which said data lines are pre-charged.

9. A memory device having increased access cycle time wherein said memory device comprises:

data lines that may be pre-charged;

a standby state during which said data lines are pre-charged, a write state during which said data lines are not pre-charged;

a read state during which said data lines are not pre-charged and wherein a transition from said write state to said read state causes said data lines to be pre-charged; and further comprising an active standby state during which no write or read takes place, during which a wordline is active, and during which said data lines are pre-charged.

10. The device according to claim 9 wherein said memory device is a DRAM device.

11. The device according to claim 10 wherein said DRAM device is a DDR device.

12. The device according to claim 9 wherein said transition from said write state to said read state is an interruption of an ongoing write.

* * * * *